United States Patent [19] [11] 3,929,526

Nuttall et al. [45] Dec. 30, 1975

[54] METHOD OF MAKING SEMI-CONDUCTOR DEVICES UTILIZING A COMPENSATING PREDIFFUSION

[75] Inventors: Roy Nuttall, Cheadle; Clifford Rowbotham, Poynton, both of England

[73] Assignee: Ferranti, Limited, Hollinwood, England

[22] Filed: Feb. 7, 1973

[21] Appl. No.: 330,406

[52] U.S. Cl. ................ 148/175; 148/191; 156/610; 156/612; 357/40; 357/48; 357/58; 357/88

[51] Int. Cl.² .................. H01L 21/22; H01L 27/04; H01L 21/76

[58] Field of Search .................... 148/174, 175, 191; 317/235 E, 357; 117/106 A, 201, 212

[56] References Cited

UNITED STATES PATENTS

| | | | |
|---|---|---|---|
| 3,170,825 | 2/1965 | Schaarschmidt | 148/175 |
| 3,328,213 | 6/1967 | Topas | 148/175 |
| 3,404,450 | 10/1968 | Karcher | 148/175 X |
| 3,660,180 | 5/1972 | Wajda | 148/175 |
| 3,669,769 | 6/1972 | Badami et al. | 148/175 |
| 3,748,545 | 7/1973 | Beale | 317/235 R |

FOREIGN PATENTS OR APPLICATIONS

| | | | |
|---|---|---|---|
| 1,314,149 | 4/1973 | United Kingdom | 148/175 |
| 1,372,779 | 11/1974 | United Kingdom | 148/175 |

OTHER PUBLICATIONS

Demsky et al., "Technique for Counteracting Epitaxial Autodoping," IBM Tech. Discl. Bull., Vol. 13, No. 3, Aug. 1970, pp. 807–808.

Calhoun et al, "Product Simulators for Epitaxy Test Cycles," Ibid., Vol. 12, No. 8, Jan. 1970, pp. 1214–1215.

Vora, M. B., "Self-Isolation Scheme for Integrated Circuits," I.B.M. J. Research & Dev., Vol. 15, No. 6, pp. 429–500, (1971).

Runyan, W. R., "Silicon Semiconductor Technology," Textbook, McGraw-Hill Book Co., 1965, pp. 69–73.

*Primary Examiner*—L. Dewayne Rutledge
*Assistant Examiner*—W. G. Saba
*Attorney, Agent, or Firm*—Cameron, Kerkam, Sutton, Stowell & Stowell

[57] ABSTRACT

In the manufacture of a semiconductor device in a semiconductor body, the device including at least part of an interface region between a substrate and an epitaxial layer of the semiconductor body, the surface portion of the substrate included in the interface region has a conductivity — type-determining impurity diffused into it before the deposition thereon of the epitaxial layer.

10 Claims, 2 Drawing Figures

METHOD OF MAKING SEMI-CONDUCTOR DEVICES UTILIZING A COMPENSATING PREDIFFUSION

Figure 1:
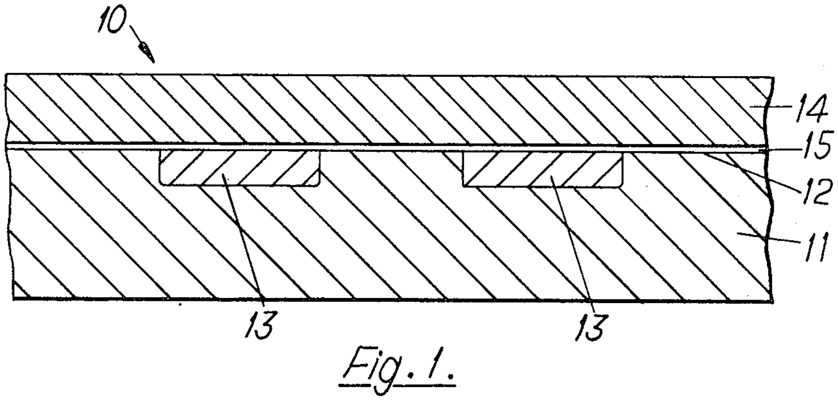

This invention relates to the manufacture of semiconductor devices and, in particular, devices formed in semiconductor bodies comprising extrinsic epitaxial layers on extrinsic semiconductor substrates, the devices including interface regions inherently formed between the bulk of the substrates and the eptiaxial layers. In this specification the terms "the bulk of the substrate" and "the bulk of the epitaxial layer" are used to refer to, respectively, the whole of the substrate and the whole of the epitaxial layer except the parts occupied by the interface region.

An extrinsic epitaxial layer of a semiconductor body is deposited onto a substrate from an atmosphere having as a constituent the conductivity-type-determining impurity required to be present in the epitaxial layer, the impurity being deposited simultaneously with the semiconductor material. The bulk of the epitaxial layer is deposited from the atmosphere in a controlled manner, the layer usually being uniformly doped with the impurity. With known ways of depositing extrinsic epitaxial layers, however, the impurity concentrations of interface regions of the order of 10 to 1000A thick and inherently produced between the bulk of the epitaxial layers and the bulk of the substrates differs from what is desirable. The concentrations of impurities of the different conductivity types in each interface region are dependent on the initial impurity concentration of the surface portions of the substrate on which the extrinsic epitaxial layer is deposited and the impurity concentration in the atmosphere, the interface region including the surface portions of the substrate. Thus, for example, the interface region may be auto-doped i.e., impurity being transferred into the interface region from the surface portions of the substrate, or impurity may diffuse into the surface portions of the substrate from other parts of the interface region. Whilst there may be steep gradients of impurity concentrations between the substrate and the epitaxial layer, it is desirable that there are no sharp changes between the gradients within the substrate and the epitaxial layer. In particular, it is desirable that the impurity concentrations in the interface region should not be such that conductivity type of the interface region is inadvertantly changed during the normal operation of a device formed in the semiconductor body.

A device formed in such a semiconductor body, and which device includes at least part of the interface region between the bulk of the epitaxial layer and the bulk of the substrate, may also include a buried heavily doped region within the semiconductor body. The buried heavily doped region is formed, before the deposition of the epitaxial layer, in the substrate adjacent to a selected part of the surface to be covered with the epitaxial layer, and by diffusion of an impurity into said substrate part through an aperture in a masking layer of diffusion-resistant material on the substrate surface. The diffusion-resistant layer before it is removed, and especially if it is of silicon oxide, may cause a depletion of the impurity concentration in the surface portions of the substrate with which it is contiguous by impurity being transferred to the layer from the substrate. The substrate surface on which the epitaxial layer is deposited, thus, has different portions of substantially different impurity concentrations, and possibly also of different conductivity types. Hence, different parts have different concentrations of the different impurities, and within the interface region transfer of impurity, for example, by diffusion, may occur into the lightly doped surface portions and from the heavily doped surface portions of the substrate.

The impurity concentrations in the interface region have a significant effect on the performance of a device formed in such a semiconductor body and including at least part of the interface region. The performance of the device is adversely effected if the impurity concentrations in the interface region differ from what is desirable, as referred to above.

It is an object of the present invention to provide a novel and advantageous method of forming a semiconductor body comprising an extrinsic epitaxial layer on an ectrinsic semiconductor substrate, the body to be employed in the manufacture of a semiconductor device including at least part of the interface region inherently formed between the bulk of the epitaxial layer and the bulk of the substrate, the body provided being such that the performance of the device is not significantly adversely affected by the interface region.

According to the present invention a method of forming a semiconductor body to be employed in the manufacture of a semiconductor device includes the steps of providing an extrinsic semiconductor substrate, initially diffusing into a surface of the substrate a conductivity-type-determining impurity, forming on the surface an epitaxial, extrinsic semiconductor layer, there being inherently an interface region having a thickness in the range 10 to 1000A between the bulk of the substrate and the bulk of the epitaxial layer deposited on the substrate, the properties of the interface region being determined by the initial diffusion of impurity.

The initial diffusion of impurity causes a desired alteration of the impurity concentrations in the interface region such that the performance of a semiconductor device including at least part of the interface region is not significantly adversely affected by the presence of the interface region.

The conductivity type of the impurity diffused into the substrate surface in the initial diffusion is selected to be such that the desired alteration of the impurity concentrations in the interface region is obtained. The impurity may be the same impurity to be deposited with the epitaxial layer. The substrate surface may be subjected in the initial diffusion to an atmosphere under the same conditions as those employed in the epitaxial deposition, except only that the semiconductor material to be deposited epitaxially is excluded from the atmosphere.

The extent of the penetration of impurity diffused into the substrate surface during the initial diffusion is substantially smaller than the extent of the penetration of impurity into a semiconductor body in order to modify the conductivity type and/or resistivity value of a region of a device to be formed in the semiconductor body.

According to another aspect the present invention comprises a semiconductor body to be employed in the manufacture of a semiconductor device, the body comprising an extrinsic semiconductor substrate having a conductivity-type-determining impurity diffused initially into a surface of the substrate, and an epitaxial, extrinsic semiconductor layer deposited on said surface, there being inherently an interface region having a thickness in the range 10 to 1000A between the bulk of the substrate and the bulk of the epitaxial layer deposited on the substrate, the properties of the interface region being determined by the initial diffusion of the impurity.

According to yet another aspect the present invention comprises a method of manufacturing a semiconductor device including forming a semiconductor body by providing an extrinsic semiconductor substrate having a conductivity-type-determining impurity diffused initially into a surface of the substrate, and depositing an epitaxial, extrinsic semiconductor layer on said surface, there being inherently an interface region having a thickness in the range 10 to 1000A between the bulk of the substrate and the bulk of the epitaxial layer deposited on the substrate, and forming the semiconductor device in the semiconductor body so as to include at least a part of the interface region, the properties of the interface region being determined by the initial diffusion of the impurity.

According to still another aspect the present invention comprises a semiconductor device in a semiconductor body comprising an extrinsic semiconductor substrate having a conductivity-type-determining impurity diffused initially onto a surface of the substrate, and an epitaxial, extrinsic semiconductor layer deposited on said surface, there being inherently an interface region having a thickness in the range 10 to 1000A between the bulk of the substrate and the bulk of the epitaxial layer deposited on the substrate, the semiconductor device including at least part of the interface region, the properties of the interface region being determined by the initial diffusion of the impurity.

Figure 2:
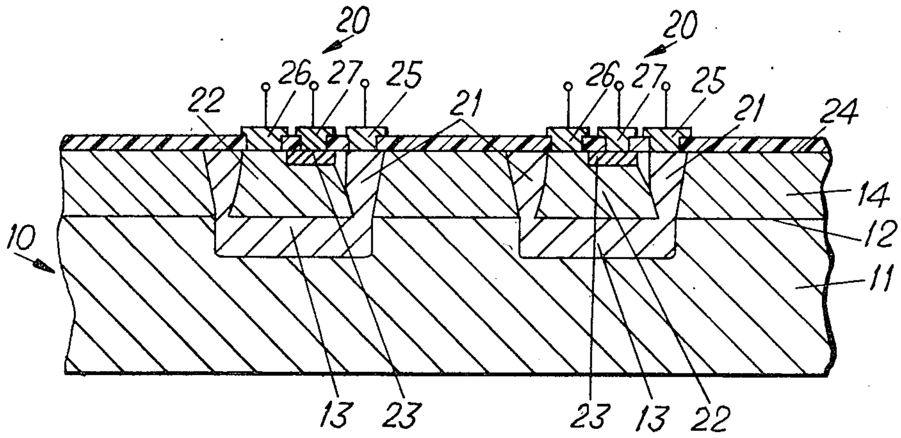

The present invention will now be described by way of example with reference to the accompanying drawings, in which FIG. 1 is a section of a semiconductor body to be employed in the manufacture of semiconductor devices, in accordance with one embodiment of the invention, and FIG. 2 is a section of devices formed in the body of FIG. 1.

The illustrated silicon semiconductor body 10 to be employed in the manufacture of semiconductor devices, comprises a P-type semiconductor substrate 11, doped with boron, and having a resistivity value in the range 10 to 20 ohm-cms. An epitaxial layer is to be deposited onto one surface 12 of the substrate to complete the semiconductor body, but, before the deposition of the semiconductor material, heavily doped N+ type regions 13 to be buried in the completed semiconductor body 10 are formed adjacent to selected parts of the substrate surface 12. These regions 13 are provided by forming a layer of silicon oxide (not shown) on the substrate surface 12. The silicon oxide is employed as a diffusion-resistant material, and apertures are etched through the silicon oxide layer to expose the selected parts of the substrate surface 12. Arsenic is diffused into the selected parts of the substrate surface 12 to form the regions 13. The silicon oxide layer is then removed. Some of the boron from surface portions of the substrate around the regions 13 is removed with the silicon oxide, this boron previously having permeated into the silicon oxide layer from the substrate 11.

Thus, the substrate surface 12 has both heavily doped N+ type surface portions and P-type surface portions depleted of boron. When the epitaxial layer 14 is deposited on the substrate surface 12 an interface region 15 of a thickness of the order of 10 to 1000A is formed inherently between the bulk of the substrate 11 and the bulk of the epitaxial layer 14. The interface region 15 includes the surface portions of the substrate on which the epitaxial layer is deposited. Whilst there may be steep gradients of impurity concentrations between the substrate and the epitaxial layer, it is desirable that there are no sharp changes between the gradients within the substrate and the epitaxial layer. In particular, it is desirable that the impurity concentrations should not be such that the conductivity type of the interface region inadvertantly changes during the normal operation of the devices to be formed in the semiconductor body 10. If the impurity concentrations in the interface region are not as referred to above the performances of devices each including a part of the interface region 15 are significantly adversely affected. However, the impurity concentrations in the interface region may differ from what is desirable because of transfer of impurity within the interface region, for example, by diffusion, such as diffusion from the heavily doped N+ type surface portions of the substrate and into the lightly doped P-type surface portions of the substrate.

According to the present invention, the propensity for the interface region 15 to have a significant adverse effect on the performance of devices including parts of the interface region 15 is reduced by having an initial diffusion of a conductivity-type-determining impurity into the substrate surface 12 before the deposition of the semiconductor material. The conductivity type of the impurity employed in this initial diffusion is selected so that the desired alteration of the impurity concentrations in the interface region is obtained. In one particular method according to the present invention the impurity employed in the initial diffusion is the same impurity as is deposited subsequently with the epitaxial layer.

The bulk of the epitaxial layer 14 subsequently deposited to complete the semiconductor body 10 is of P-type, being doped with boron, the resitivity value of the layer 14 being arranged to be 1 ohm-cm. The epitaxial layer 14 is deposited on the substrate surface 12 in a conventional deposition cell from an atmosphere at a temperature of 1250°C and containing hydrogen, silicon tetrachloride and diborane. The concentration of the boron in the atmosphere is of the order of 0.004 parts per million. However, an initial diffusion of boron into the substrate surface, in accordance with the present invention, is caused before the silicon tetrachloride is introduced into the atmosphere within the cell. This initial diffusion of the boron into the substrate surface 12 is for a period of 2 minutes, and the extent of the penetration of the impurity is substantially smaller than when the conductivity type and/or resistivity value of a region of a device, to be formed in the semiconductor body, is being changed.

As shown in FIG. 2, subsequently, semiconductor devices 20 are formed in the semiconductor body 10. Each device 20 which is formed by a known method, includes a buried heavily doped region 13, and hence includes part of the interface region 15, which region 15 is not shown in FIG. 2 for the sake of clarity. Each illustrated device 20 comprises a transistor of the so-called collector-diffusion-isolation construction, and has a collector comprising a buried heavily doped region 13 and an isolation barrier 21 for the device. The isolation barrier 21 is also N+ type, and is formed by diffusion to extend through the epitaxial layer 14 into contact with the buried heavily doped region 13. The isolation barrier 11 defines a P-type base 22 within the epitaxial layer 14, and an N+ type emitter 23 is formed by diffusion in part of the base 22. The device is covered with a passivating layer 24 of silicon oxide. Contacts 25, 26 and 27, respectively, to the collector, base and emitter of the transistor, extend through apertures in the silicon oxide layer 24 to make ohmic contact with the semiconductor regions beneath.

The semiconductor bodies formed according to the present invention may be employed in the manufacture of devices other than transistors. In addition, if the devices comprise transistors, they may have other types of construction than the collector-diffusion-isolation construction. If the devices are not transistors they may or may not have constructions closely resembling that of a collector-diffusion-isolation transistor.

However, each device includes at least part of the interface region between the bulk of the epitaxial layer and the bulk of the substrate of the semiconductor body in which the device is formed. A device which includes at least part of the interface region may not necessarily include a buried heavily doped region.

The initial diffusion of impurity into the surface portions of the substrate may be a separate process step from the epitaxial deposition of the extrinsic layer, there being a finite interval between the initial diffusion into the substrate surface and the epitaxial deposition of semiconductor material onto the substrate surface.

The initial diffusion may be of an impurity characteristic of either P or N conductivity type, and the epitaxial layer to be deposited on the substrate also may be of either P or N conductivity type and may have any desired resistivity value.

The substrate may have any convenient resistivity value, for example, semiconductor material having a resistivity value of 0.1 ohm-cm may be employed.

The conditions under which the initial diffusion of impurity into the substrate surface is made may not closely resemble the conditions under which the epitaxial deposition is made. Thus, the concentration of impurity in the atmosphere in the deposition cell during the initial diffusion may be significantly different from the impurity concentration during the epitaxial deposition. Hence, the impurity concentration diffused into the surface portions of the substrate during the initial diffusion may be significantly different from that in the epitaxial layer subsequently deposited on the substrate surface.

What we claim is:

1. A method of manufacturing a semiconductor device includes forming a semiconductor body by providing a semiconductor substrate of one conductivity type, forming in a first diffusion step a heavily doped region of opposite conductivity type adjacent to selected parts of one surface of the substrate, diffusing into said surface of the substrate in a second diffusion step a conductivity-type-determining impurity to provide an impurity characteristic of said one conductivity type, and subsequently depositing semiconductor material on said surface of the substrate to form an epitaxial layer of said one conductivity type from an atmosphere having as a constituent a conductivity-type-determining impurity of said one conductivity type, the epitaxial deposition being obtained solely by modifying the conditions under which the second diffusion step was performed such that the atmosphere above the substrate during the epitaxial deposition also contains a source of the semiconductor material of the epitaxial layer, there being inherently an interface region having a thickness in the range of 10 to 1000A between the bulk of the substrate and the bulk of the epitaxial layer deposited on the substrate, the properties of the interface region being determined by the diffusion of the conductivity-type-determining impurity providing an impurity characteristic of said one conductivity type.

2. A method as claimed in claim 1 in which the first diffusion step by which the heavily doped region is formed in the substrate includes diffusion of a diffusion resistant layer on said substrate, exposing said selected parts of the substrate surface by forming apertures in the diffusion resistant layer, diffusing an impurity into the selected parts of the exposed substrate surface through said apertures in the layer of diffusion-resistant material on the substrate surface, and removing the diffusion-resistant material before the diffusion of impurity into the substrate surface of the conductivity-type-determining impurity in the second diffusion step.

3. A method as claimed in claim 2 in which the diffusion-resistant material is silicon oxide.

4. A method as claimed in claim 1 in which the heavily doped region comprises part of a collector of a transistor, and the method further includes completing the collector by diffusing an isolation barrier for the transistor extending through the epitaxial layer into contact with the heavily doped region.

5. A method as claimed in claim 1 wherein said first diffusion step for forming said heavily doped regions includes diffusing a diffusion resistant layer on said substrate, etching through said layer to expose said selected parts of the substrate surface, diffusing into the selected part a conductivity type determining impurity of said one conductivity type to form said heavily doped region and removing said diffusion resistant layer prior to the diffusion into said surface of said conductivity-type-determining impurity.

6. A method as claimed in claim 1 in which the impurity is boron.

7. A method as claimed in claim 6 wherein the epitaxial layer is deposited on the substrate surface from an atmosphere containing hydrogen, silicon tetrachloride and diborane, said initial diffusion into said surface being caused before the silicon tetrachloride is introduced into said atmosphere.

8. A method of manufacturing a semiconductor device includes forming a semiconductor body by providing a semiconductor substrate of one conductivity type, forming in a first diffusion step a heavily doped region of an opposite conductivity type adjacent to selected parts of one surface of the substrate, diffusing a conductivity-type-determining impurity of said one conductivity type into said surface of the substrate in a second diffusion step, subsequently depositing semiconductor material on said surface of said substrate to form an epitaxial semiconductor layer on said surface from an atmosphere having as a constituent a conductivity-type-determining impurity of said one conductivity type, the epitaxial deposition being obtained solely by modifying the conditions under which the second diffusion step was performed such that the atmosphere above the substrate during the epitaxial deposition also contains a source of the semiconductor material of the epitaxial layer, there being inherently an interface region having a thickness in the range of 10 to 1000A between the bulk of the substrate and the bulk of the epitaxial layer deposited on the substrate, and forming the semiconductor device in the semiconductor body at the selected parts so as to include said heavily doped region and at least a part of the interface region, the properties of the interface region being determined by the diffusion of the conductivity-type-determining impurity providing an impurity characteristic of said one conductivity type.

9. A method as claimed in claim 8 wherein the impurity is boron.

10. A method as claimed in claim 9 wherein the epitaxial layer is deposited on the substrate surface of an atmosphere containing hydrogen, silicon tetrachloride and diborane, said initial diffusion into said surface being caused before the silicon tetrachloride is introduced into said atmosphere.

* * * * *

UNITED STATES PATENT OFFICE
CERTIFICATE OF CORRECTION

PATENT NO. : 3,929,526
DATED : Dec. 30, 1975
INVENTOR(S) : Roy Nuttall; Clifford Rowbotham It is certified that error appears in the above-identified patent and that said Letters Patent are hereby corrected as shown below:

--[30] Foreign Application Priority Data

February 11, 1972-Great Britain-6407/72 --

Signed and Sealed this

*eighteenth* Day of *May 1976*

[SEAL]

*Attest:*

RUTH C. MASON
*Attesting Officer*

C. MARSHALL DANN
*Commissioner of Patents and Trademarks*